US011552335B2

(12) United States Patent
Koestner et al.

(10) Patent No.: US 11,552,335 B2
(45) Date of Patent: Jan. 10, 2023

(54) CIRCUIT BOARD HAVING POWER SUPPLY, ELECTRICAL DEVICE HAVING CIRCUIT BOARD, AND METHOD FOR PRODUCING A CIRCUIT BOARD

(71) Applicant: TDK Electronics AG, Munich (DE)

(72) Inventors: Stefan Koestner, Donnerskirchen (AT); Masahiro Oishi, Deutschlandsberg (AT); Franz Rinner, Frauental (AT)

(73) Assignee: TDK ELECTRONICS AG, Munich (DE)

( * ) Notice: Subject to any disclaimer, the term of this patent is extended or adjusted under 35 U.S.C. 154(b) by 531 days.

(21) Appl. No.: 16/616,793

(22) PCT Filed: May 30, 2018

(86) PCT No.: PCT/EP2018/064266
§ 371 (c)(1),
(2) Date: Nov. 25, 2019

(87) PCT Pub. No.: WO2018/220058
PCT Pub. Date: Dec. 6, 2018

(65) Prior Publication Data
US 2020/0083570 A1    Mar. 12, 2020

(30) Foreign Application Priority Data

May 31, 2017    (DE) .......................... 102017111970.1

(51) Int. Cl.
*H05K 1/16*    (2006.01)
*H01M 10/42*    (2006.01)
(Continued)

(52) U.S. Cl.
CPC ..... *H01M 10/425* (2013.01); *H01M 10/0436* (2013.01); *H01M 10/0562* (2013.01);
(Continued)

(58) Field of Classification Search
CPC .................... H05K 1/16; H05K 1/184; H05K 2201/10037; H05K 2201/10053; H01M 10/425; H01M 10/0436; H01M 10/0562
See application file for complete search history.

(56) References Cited

U.S. PATENT DOCUMENTS 5,073,684 A * 12/1991 Miyabayashi .... H01M 10/0565
429/127
5,147,985 A    9/1992 DuBrucq
(Continued)

FOREIGN PATENT DOCUMENTS

JP    S5853162 A    3/1983
JP    2001308537 A    11/2001
(Continued)

*Primary Examiner* — Hoa C Nguyen
(74) *Attorney, Agent, or Firm* — Slater Matsil, LLP

(57) ABSTRACT

A circuit board having a power supply, an electrical device having a circuit board, and a method for producing a circuit board are disclosed. In an embodiment a circuit board includes a power supply, a carrier substrate and an energy store with a first layer stack having a first electrode layer with a first electrode, a second electrode layer with a second electrode, and an electrolyte layer arranged therebetween, which has an electrolyte, wherein the first electrode, the second electrode and the electrolyte are solid states.

5 Claims, 4 Drawing Sheets

(51) Int. Cl.
*H01M 10/04* (2006.01)
*H01M 10/0562* (2010.01)
*H05K 1/18* (2006.01)
*H01M 50/209* (2021.01)

(52) U.S. Cl.
CPC ............ *H01M 50/209* (2021.01); *H05K 1/16* (2013.01); *H05K 1/184* (2013.01); *H05K 2201/10037* (2013.01); *H05K 2201/10053* (2013.01)

(56) References Cited

U.S. PATENT DOCUMENTS

| | | | |
|---|---|---|---|
| 6,664,001 B2 | 12/2003 | Yamazaki et al. | |
| 9,224,684 B2 | 12/2015 | Kubota et al. | |
| 2002/0142193 A1 | 10/2002 | Yang | |
| 2004/0106046 A1* | 6/2004 | Inda | H01M 10/0436 29/623.5 |
| 2005/0158619 A1* | 7/2005 | Honda | H01M 10/0525 429/161 |
| 2014/0162113 A1 | 6/2014 | Ohta et al. | |
| 2015/0311493 A1* | 10/2015 | Abe | H01M 4/622 429/7 |
| 2016/0118658 A1* | 4/2016 | Kawakami | H01M 4/366 427/126.3 |
| 2016/0181671 A1 | 6/2016 | Keates et al. | |
| 2018/0083304 A1* | 3/2018 | Horibe | H01M 4/485 |

FOREIGN PATENT DOCUMENTS

| | | |
|---|---|---|
| JP | 2011023361 A | 2/2011 |
| WO | 2014111306 A1 | 7/2014 |

\* cited by examiner

CIRCUIT BOARD HAVING POWER SUPPLY, ELECTRICAL DEVICE HAVING CIRCUIT BOARD, AND METHOD FOR PRODUCING A CIRCUIT BOARD

This patent application is a national phase filing under section 371 of PCT/EP2018/064266, filed May 30, 2018, which claims the priority of German patent application 102017111970.1, filed May 31, 2017, each of which is incorporated herein by reference in its entirety.

TECHNICAL FIELD

The invention relates to energy supplies for electrical circuits, e.g., for circuits of a circuit board.

BACKGROUND

In general, electrical circuits require electrical energy to operate. It is possible to supply electrical circuits with electrical energy from an external energy source by means of a power connection. Alternatively, it is possible to arrange a battery or an accumulator on the upper side of a circuit board and to use it as an energy source.

As a result of the continuing trend towards miniaturisation of electrical components, the volume of a battery is occupying, in relative terms, a larger and larger proportion of the total volume of an electrical device.

In the case of those devices which do not have a battery, there is always a risk of a sudden loss of contact and, consequently, of the circuit no longer being supplied with electrical power.

SUMMARY OF THE INVENTION

Embodiments provide possibilities of supplying a circuit board with electrical energy. Various embodiments provide reliable energy supply should, allow greater energy densities than batteries and be compatible with the continuing trend towards miniaturisation.

In embodiments a circuit board having a power supply comprises a carrier substrate and an energy store. The energy store has a first layer stack with a first electrode layer, a second electrode layer, and an electrolyte layer arranged therebetween. The first electrode layer has a first electrode, the second electrode layer has a second electrode, and an electrolyte is arranged in the electrolyte layer. The first electrode, the second electrode and the electrolyte are solid states.

Therefore, a circuit board having a solid-state energy store is indicated, which can be used to supply the circuit board with power.

The use of a solid-state energy store, e.g., a solid-state battery or a solid-state accumulator, does not have any liquid components, e.g., liquid electrolytes, which can escape or degas. A solid-state energy store is consequently practically maintenance-free and more temperature-resistant than conventional batteries or accumulators.

Solid-state energy stores are compatible with the processing steps for producing a circuit board and can be manufactured in a plurality of different shapes. Circuit boards having such power supplies have a significantly better ratio of energy density and volume, and are therefore very suitable for further miniaturisation.

Accordingly, it is possible that the energy store is a solid-state battery or a solid-state accumulator.

It is possible that the energy store is directly embedded in the circuit board. Alternatively or in addition, it is possible that the energy store or a further energy store is arranged on the underside or on the upper side of the circuit board.

Solid-state energy stores have a layer construction made up of thin layers and allow a significantly higher energy density than conventional batteries or conventional accumulators. For that reason, such energy stores only extend the design height of a circuit board to a very small extent.

It is possible that the first layer stack additionally comprises a first active layer between the first electrode and the electrolyte, and a second active layer between the electrolyte and the second electrode.

The active layer can contain an active material or consist of an active material which is conductive both for electrons and for ions.

The solid-state electrolyte of the energy store is a material which is permeable for ions, but not for electrons.

The first electrode and the second electrode can comprise various materials or consist of various materials. It is preferable if the two electrodes of the layer stack of the energy store have significantly different electrode potentials.

It is possible that the circuit board has one or more additional layer stacks. Each of the additional layer stacks likewise has a first electrode, a second electrode, and an electrolyte arranged therebetween.

It is possible that two or more layer stacks together constitute a block. The circuit board can comprise further blocks made of layer stacks. Each block provides an electric potential.

To this end, it can be provided that the layer stacks are wired to one another within a block in a suitable manner, e.g., in series or parallel. It is thus possible that multiple layer stacks are wired in parallel within a block so that a block provides a greater capacity, while the voltage made available by the block corresponds to the voltage of a layer stack.

The different blocks can be wired in series in order to provide different voltages.

The voltage made available by a single block or a single layer stack substantially depends on the materials used for the electrodes.

The usual electrode materials of batteries or accumulators are eligible as the electrode materials.

It is possible that the circuit board has, in addition, one or more metallisation layers. The metallisation layers can have structured metallisations in the carrier substrate. The metallisations are connected by means of vias (through-connections) to the first and the second electrode of the energy store and, possibly, further electrodes of additional layer stacks and/or of additional blocks of the energy store.

The structured metallisations can constitute energy supply lines or signal lines. It is also possible to form electrical circuit components, e.g., inductive elements, capacitive elements or resistive elements, in the metallisation layers.

Different metallisation layers can be segregated by the dielectric material of the carrier substrate.

It is possible that the circuit board additionally comprises an electrical component. In addition, the circuit board can comprise a switch which is connected to the electrical component and the energy store.

The electrical component can be connected in an electrically conductive manner to the energy store by means of the switch. Alternatively, the switch can be used to separate the electrical component galvanically from the energy store.

It is therefore possible, in the event of a malfunction of the electrical component or in the event of a malfunction of the energy store, to separate the two circuit elements from one another by means of such a switch.

It is possible that the circuit board has an external power connection. The circuit board and circuit elements arranged on the circuit board and wired to the circuit board can be supplied with electrical power by means of the external power connection. In the event of an interruption in said external energy supply, the energy store of the circuit board can take over the short-term or medium-term energy supply.

The energy store of the circuit board can also be charged by means of the external power connection.

It is possible that the circuit board comprises, in addition, a chip having an integrated circuit. The chip or its integrated circuit is provided and suitable for monitoring, controlling or adjusting a parameter of the energy store.

Such a parameter can, for example, be the state of charge of the energy store. The monitoring of a maintenance condition of the energy store is also possible. Thus, the service life of the energy store can be increased and, if necessary, maintenance measures, e.g., recovery routines, can be performed.

It is accordingly possible that the circuit board is part of an electrical device. In addition to the circuit board, the electrical device also has one or more electrical or electronic circuit components which are connected and wired to the circuit board. The energy store is provided to supply the circuit components at least intermittently with electrical energy.

Such circuit boards or respectively such electrical devices operate in a maintenance-free manner, are temperature-resistant and not combustible.

Thanks to the temperature resistance, it is possible to perform the standard processing steps during the production of circuit boards and electrical circuits, e.g., soldering, e.g., reflow soldering, in order to arrange and wire electrical components such as SMDs (SMD=Surface-Mounted Device=surface-mounted circuit component).

A plurality of different voltages and capacities can be provided by the energy store, depending on the way in which different blocks or different layer stacks are contacted (either in series or in parallel) by an outer side of the carrier substrate.

During the integration of layer stacks of the energy store in the material of the circuit board, it is possible to contact the electrodes by means of electroplating. This can save on sputter steps in the backend process. Copper can be used as the material of the metallisation layers and, therefore, as the material of the electrical lines.

Embodiments provide a method for producing a circuit board that can comprise the following steps:

providing a material for a carrier substrate, arranging a layer stack having electrode layers and solid-state electrolytes in order to form one or more energy stores on the material of the carrier substrate, arranging a dielectric material on the layer stack of the energy store.

Further possible additional or alternative steps are:

arranging dielectric layers and metallisation layers therebetween, structuring the metallisation layers between the dielectric layers before further dielectric material of further dielectric layers is arranged on the respective metallisation layer, generating through-connections from the upper side of the circuit board to electrode layers of the energy store, connecting and wiring the through-connections to electrical components on the upper side of the carrier substrate.

BRIEF DESCRIPTION OF THE DRAWINGS

Embodiments of the circuit board and details are explained in greater detail in the schematic figures, wherein.

DETAILED DESCRIPTION OF THE ILLUSTRATIVE EMBODIMENTS

Figure 1:
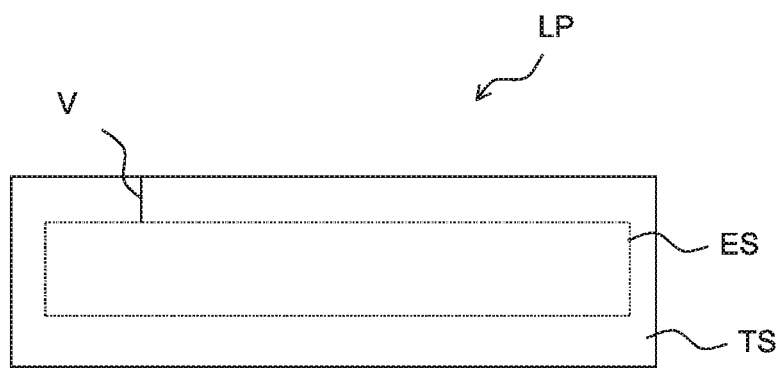
FIG. 1 shows a possible arrangement of the energy store in a carrier substrate.

FIG. 1 shows the possibility of a circuit board LP, in which the energy store ES is arranged in the interior of a carrier substrate TS. To ensure that the energy store ES in the interior of the carrier substrate TS is accessible, there exists a through-connection (via) V, by means of which an electric potential made available by the energy store ES is accessible.

The energy store ES is preferably configured as a multi-layer system having a first electrode and a second electrode, and an electrolyte arranged therebetween. All of the components of the energy store are preferably solid states. The energy store ES does not have any liquid components. As a result, the energy store is practically maintenance-free, temperature-resistant and substantially not sensitive to different forms of external harmful influences.

Figure 2:
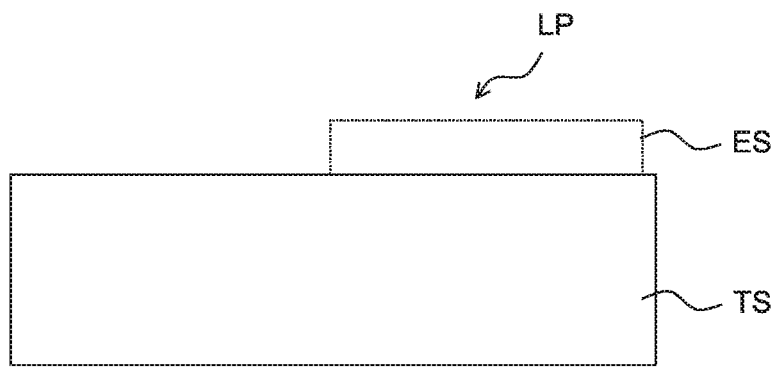
FIG. 2 shows the arrangement of the energy store on a carrier substrate.

FIG. 2 shows the possibility of arranging the energy store ES on the upper side of a carrier substrate TS.

Figure 3:
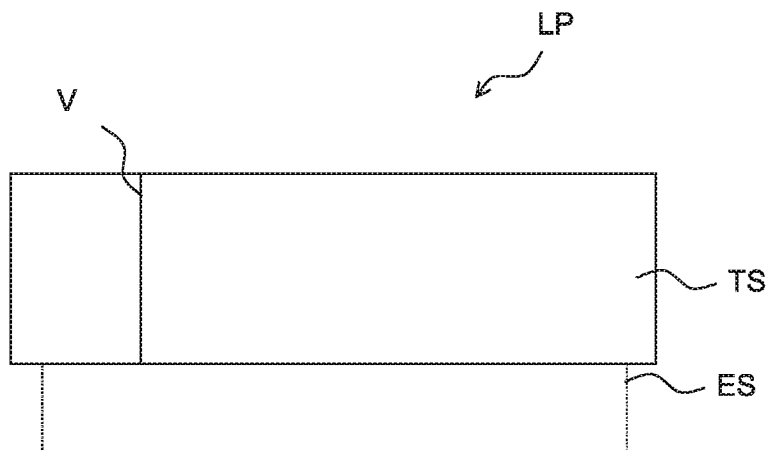
FIG. 3 shows the arrangement of the energy store on the underside of a carrier substrate.

FIG. 3 shows the possibility of arranging the energy store on the underside of the carrier substrate TS. To ensure that circuit elements and electrical components can be arranged and wired on the upper side of the carrier substrate and can be supplied with electrical energy, there exists at least one through-connection V, by means of which circuit components on the upper side can be wired to the energy store ES on the underside.

Irrespective of the respective position of the energy store in the carrier substrate, whether on the upper side of the carrier substrate or on the underside of the carrier substrate, the energy store ES can substantially extend over the entire width of the circuit board LP. It is also possible that the energy store merely occupies a region of the base area of the circuit board.

The design of the energy store ES as a layer stack made of thin layers makes possible an extremely low height so that a high specific energy density is obtained. The design height of the circuit board and, therefore, the design height of an associated electrical device is practically unaffected by the additional layers of the energy store.

Figure 4:
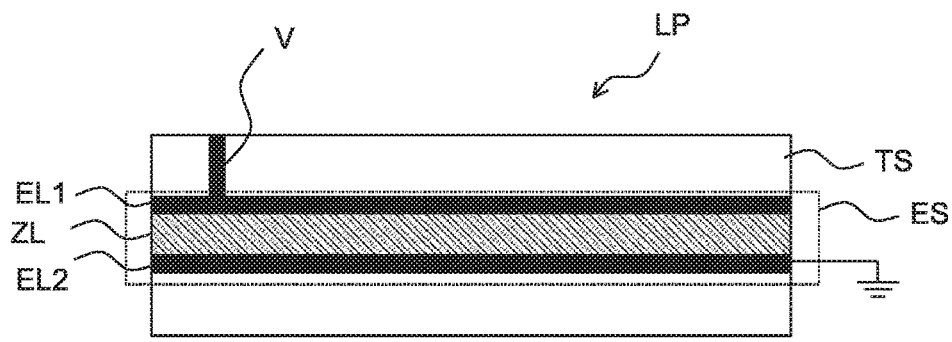
FIG. 4 shows a multi-layer construction of the energy store.

FIG. 4 shows the possibility of an arrangement of the layer stack of the energy store ES: the energy store has a first electrode EL1 and a second electrode EL2 in a respective associated electrode layer. An intermediate layer ZL having an electrolyte is arranged between the electrodes. The electrolyte likewise consists of a solid state and is substantially permeable for ions, but not for electrons.

It is possible that at least one of the two electrodes, e.g., the first electrode EL1 or—as shown in FIG. 4—the second electrode EL2, is wired to an earth potential. The first electrode EL1 can then make available a different electric potential from the earth potential on the upper side by means of a through-connection V.

Figure 5:
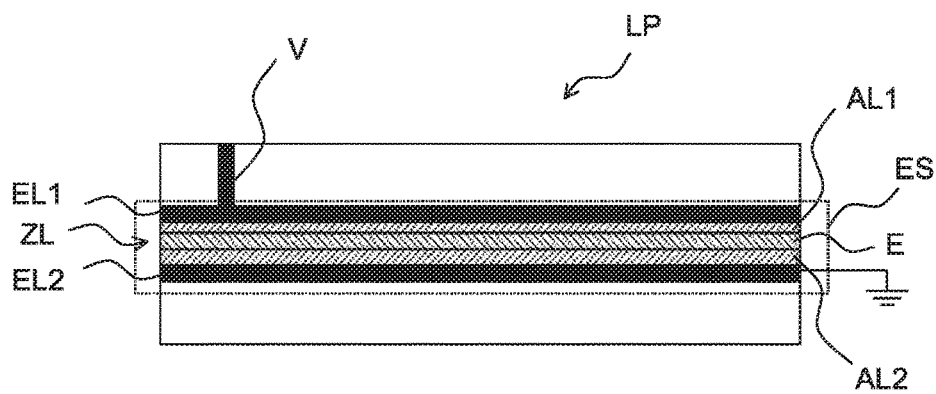
FIG. 5 shows an energy store having additional layers.

FIG. 5 shows the possibility of configuring the energy store ES as a layer stack having five layers. In addition to the first electrode EL1, the intermediate layer ZL and the second electrode layer EL2, there is a first active layer AL1 and a second active layer AL2. The first active layer AL1 is arranged between the electrode layer having the first electrode EL1 and the intermediate layer ZL having the electrolyte E. The second active layer AL2 is arranged between the electrolyte E in the intermediate layer ZL and the second electrode EL2. The first and the second active layer are preferably conductive with respect to ions. They can also be conductive with respect to electrons. Admittedly, it is also possible that they are not conductive for electrons.

Figure 6:
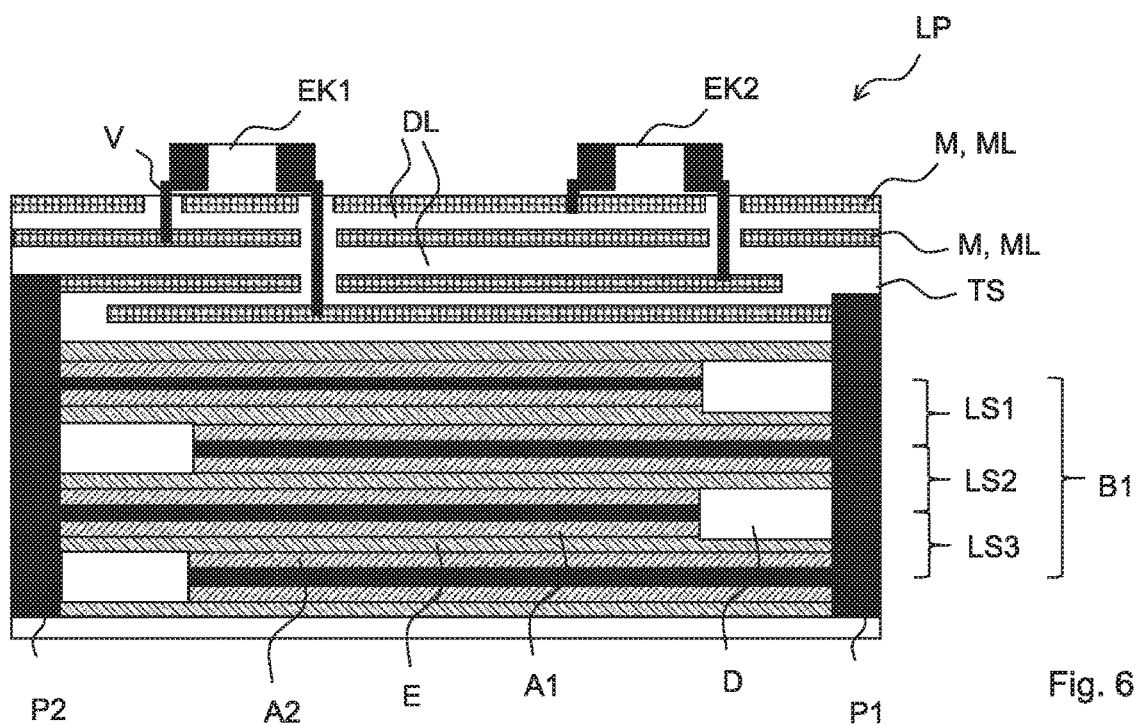
FIG. 6 shows a circuit board having additional layers and electrical components.

FIG. 6 shows the possibility of combining various layer stacks of the energy store. A first layer stack LS1, a second layer stack LS2 and a third layer stack LS3 are arranged above one another. Each layer stack has a first electrode in an electrode layer and a second electrode in a different electrode layer from the first electrode layer. In addition, each layer stack has an electrolyte between the electrodes. Layer stacks arranged next to one another can share material of an electrode. Thus, the first layer stack LS1 and the second layer stack LS2 share material of an electrode, namely of the second electrode EL2 of the first layer stack and of the first electrode of the second layer stack LS2.

In total, the three layer stacks LS1, LS2, LS3 create a first block B1. A part of the electrodes of the various layer stacks in the first block are joined at a first electrode of the block. The remaining electrodes of the layer stacks are joined at a second electrode. The first block B1 makes the two different potentials P1, P2 available by means of these electrodes of the block B1.

The three layer stacks constitute individual battery elements which are connected in parallel within the first block B1.

Electrical components EK1, EK2 are connected and wired on the upper side of the circuit board LP to metallisations M in metallisation layers ML in the interior of the carrier substrate TS by means of through-connections V. Thus, the electrical energy stored in the energy store can be used to supply electrical components on the upper side of the circuit board LP.

Metallisations of different metallisation layers ML can be electrically separated from each other by the dielectric material of the carrier substrate TS.

Figure 7:
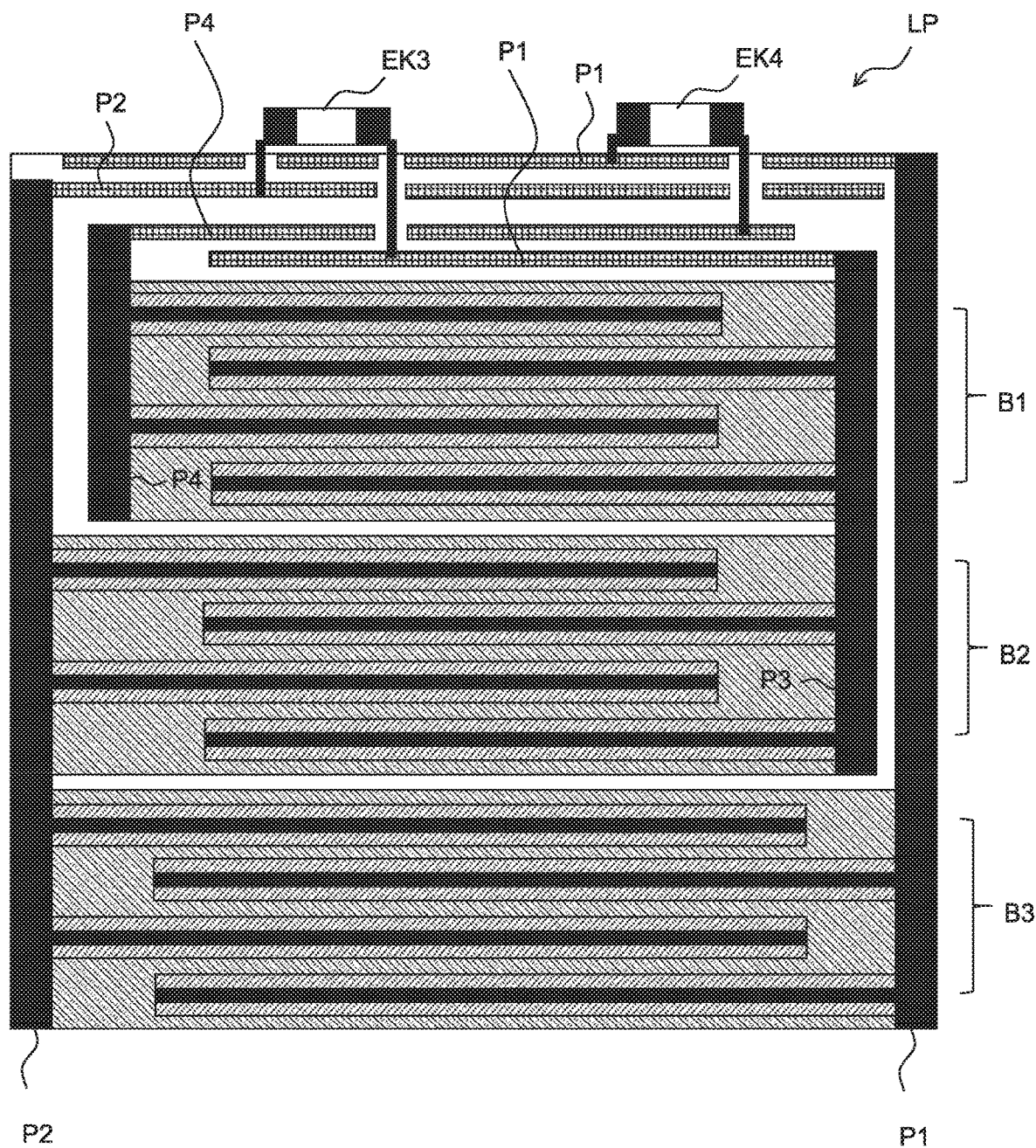
FIG. 7 shows a circuit board having multiple blocks.

FIG. 7 shows the possibility of providing different blocks in the circuit board. A first block B1 has three different layer stacks. A second block B2 has three different layer stacks and a third block B3 has three different layer stacks. The first block B1 makes available two different electric potentials P3, P4 at its outer electrodes. The second block B2 makes available a voltage at its outer electrodes, which voltage corresponds to the difference in the electric potentials P3 and P2. The third block B3 makes available a voltage at its outer electrodes, which voltage corresponds to the potential difference between the potentials P1 and P2.

The three blocks B1, B2 and B3 thus make available three voltages. The voltages can be added by series circuits.

It is possible that electrical components EK3, EK4 on the upper side of the circuit board LP are connected by means of metallisations and through-connections having the different electric potentials.

Suitably arranged layer stacks and blocks can accordingly be used to make available different voltages and different electrical capacities for different needs to the different electrical components.

Figure 8:
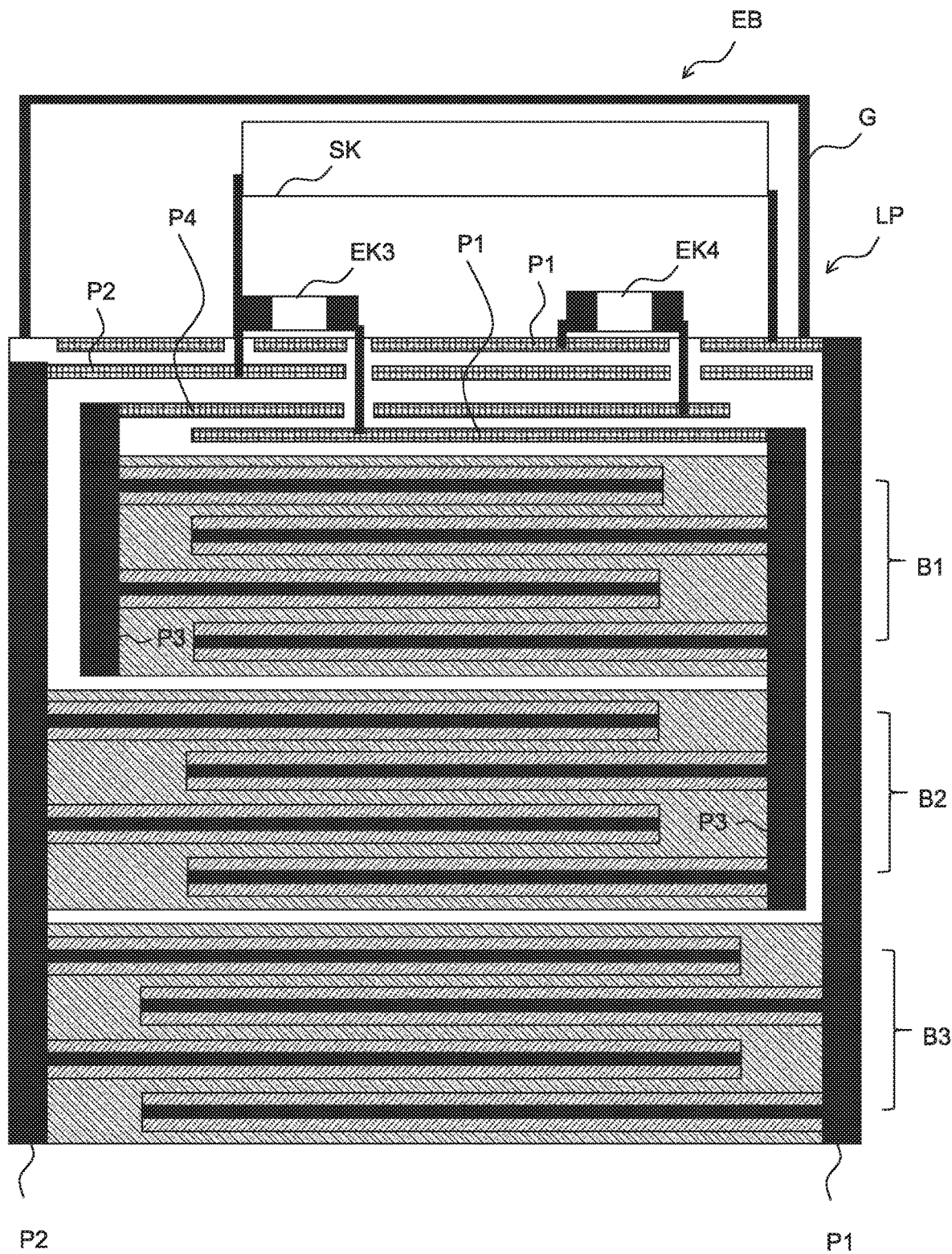
FIG. 8 shows an electrical device having a circuit board.

FIG. 8 shows the possibility of providing a corresponding circuit board LP as part of an electrical device EB. In addition to electrical components EK3, EK4 which can be assigned to the circuit board, further circuit components SK can be connected and wired to the circuit board and obtain electrical power from the energy store of the circuit board. A housing G can protect electrical components and circuit components on the upper side of the circuit board from harmful external influences.

The circuit board, the electrical device and method for producing the circuit board are not restricted to the embodiments shown or to the technical details shown. A circuit board can, for example, comprise further layers, layer stacks, blocks and energy stores under a carrier substrate, in the carrier substrate or on the carrier substrate, or additional electrical components or circuit components.

The invention claimed is:

1. A circuit board comprising:
   a carrier substrate;
   an energy store with a first layer stack having a first electrode layer with a first electrode, a second electrode layer with a second electrode, and an electrolyte layer arranged therebetween, which has an electrolyte,
   wherein the first electrode, the second electrode and the electrolyte are solid states,
   wherein the energy store is a solid-state battery or a solid-state accumulator,
   wherein the first layer stack further comprises a first active layer between the first electrode and the electrolyte layer, and a second active layer between the electrolyte layer and the second electrode,
   wherein the circuit board comprises one or more additional layer stacks, each additional layer stack having a first electrode, a second electrode and an electrolyte layer arranged therebetween,
   wherein the first layer stack and the additional layer stack together constitute a block,
   wherein the circuit board further comprises one or more further blocks with layer stacks, and
   wherein each block is configured to provide an electric potential;
   one or more metallization layers having structured metallizations in the carrier substrate, wherein the metallization layers are connected by vias to the first and the second electrode of the energy store;
   an electrical component; and
   a switch connected to the electrical component and the energy store,
   wherein the energy store is maintenance-free and temperature resistant, and
   wherein the energy store is configured to establish a power supply.

2. The circuit board according to claim 1, further comprising an external power connection.

3. The circuit board according to claim 1, further comprising an integrated circuit chip configured for monitoring, controlling or adjusting a parameter of the energy store.

4. An electrical device comprising:
   the circuit board according to claim 1; and electrical or electronic circuit components connected and wired to the circuit board, wherein the energy store is configured to supply the circuit components at least intermittently with electrical energy.

5. A method for producing the circuit board according to claim 1, the method comprising:

providing a material for the carrier substrate;

arranging a layer stack having electrode layers and solid-state electrolytes in order to form one or more energy stores on the material of the carrier substrate; and arranging a dielectric material on the layer stack of the one or more energy stores.

\* \* \* \* \*